United States Patent
Thomas et al.

(10) Patent No.: US 9,063,174 B2
(45) Date of Patent: Jun. 23, 2015

(54) HALL EFFECT MEASUREMENT INSTRUMENT WITH TEMPERATURE COMPENSATION

(71) Applicants: Andrew Thomas, Westford, MA (US); Steven Besser, Framingham, MA (US)

(72) Inventors: Andrew Thomas, Westford, MA (US); Steven Besser, Framingham, MA (US)

(73) Assignee: Olympus Scientific Solutions Americas Inc.

( * ) Notice: Subject to any disclaimer, the term of this patent is extended or adjusted under 35 U.S.C. 154(b) by 49 days.

(21) Appl. No.: 14/077,322

(22) Filed: Nov. 12, 2013

(65) Prior Publication Data

US 2014/0132254 A1     May 15, 2014

Related U.S. Application Data

(60) Provisional application No. 61/726,232, filed on Nov. 14, 2012.

(51) Int. Cl.
| | |
|---|---|
| G01N 27/72 | (2006.01) |
| G01R 33/07 | (2006.01) |
| G01R 1/44 | (2006.01) |
| G01D 3/036 | (2006.01) |
| G01R 33/00 | (2006.01) |
| G01B 7/06 | (2006.01) |
| G01D 5/14 | (2006.01) |

(52) U.S. Cl.
CPC ............... G01R 1/44 (2013.01); G01D 3/0365 (2013.01); G01R 33/0035 (2013.01); G01R 33/0082 (2013.01); G01R 33/072 (2013.01); G01B 7/10 (2013.01); G01D 5/142 (2013.01)

(58) Field of Classification Search
CPC ..................................................... G01N 27/72
USPC ........................................................ 324/225
See application file for complete search history.

(56) References Cited

U.S. PATENT DOCUMENTS

| | | |
|---|---|---|
| 4,327,416 A | 4/1982 | Jerrim |
| 6,154,027 A | 11/2000 | Alexander et al. |
| 2008/0074108 A1 | 3/2008 | Ausserlechner |

*Primary Examiner* — Bot Ledynh
(74) *Attorney, Agent, or Firm* — C. Tricia Liu (57) ABSTRACT

Disclosed is a Hall Effect instrument with the capability of compensating for temperature drift consistently, accurately and in real time of operation. The instrument embodies a four-point ohm meter circuit measuring Hall Effect sensor resistance and tracking the effect of temperature on the Hall Effect sensor. The instrument takes into account a relationship between the temperature and a temperature compensation index on a per probe basis, which has exhibited a deterministic difference observed by the present inventor.

18 Claims, 11 Drawing Sheets

Hall Effect Measurement Circuit

HALL EFFECT MEASUREMENT INSTRUMENT WITH TEMPERATURE COMPENSATION

CROSS-REFERENCE TO RELATED APPLICATIONS

This application claims the benefit and priority of U.S. Provisional patent application Ser. No. 61/726,232 filed Nov. 14, 2012 entitled A HALL EFFECT MEASUREMENT DEVICE WITH TEMPERATURE COMPENSATION, the entire disclosure of which is incorporated herein by reference.

FIELD OF THE INVENTION

The present invention relates to non-destructive testing and non-destructive instruments (NDT/NDI) and more particularly to a Hall Effect probe and measurement device with compensation of measurement drift caused by temperature change.

BACKGROUND OF THE INVENTION

Hall Effect sensors have been used in measurement devices such as thickness gages (e.g. Olympus NDT Magna Mike 8500) to accurately measure thickness of nonferrous materials. One of the most often seen applications is thickness measurement on plastic bottles. A Hall Effect sensor typically comprises a probe that has magnet(s) generating a primary magnetic field. Measurements are performed by holding the device's magnetic probe to one surface of the test material and placing a small steel target ball on the opposite surface. The target ball, in responding to the primary magnetic field, generates a secondary magnetic field, which varies according to the distance between the probe and the steel target ball. A Hall-effect sensor, which measures the strength of the secondary magnetic field, built into the probe measures the distance between the probe tip and target ball. Typically measurements are instantly displayed as easy-to-read digital readings on the device display panel.

One unique challenge encountered and overcome by the present disclosure involves a hall sensor that is not part of an integrated circuit on board the instrument. As required by many Hall Effect instruments or applications, a major portion of the circuitry is assembled on the main body of the instrument, which is coupled to the Hall Effect sensor or probe via wires or cables with a length that meets the operator's needs, e.g. 1 meter. This physical distance between the Hall Effect sensor and the instrument presents an unknown wiring and connector resistance. As the Hall Effect sensor is located in the probe and sensitive to temperature changes, it presents a unique challenge for the instrument to compensate the temperature of the probe assembly including both magnetic parts and the Hall effect sensor.

It also presents more unique challenges when the operation of a Hall effect sensor based instrument involves interchange of Hall sensor probes and gage and maintaining an accurate and temperature compensated system.

However, it's been widely observed that the accuracy of a measurement from a Hall effect thickness gage drifts with temperature quite noticeably. It is also known that the resistance of the Hall Effect sensor varies with temperature. Because the measurement is directly related to the resistance of the Hall Effect sensor, a change in temperature would result in a change in the Hall Effect resistance and a change in the result of the magnetic measurement. This is also called measurement drift due to temperature.

An existing effort made in an attempt to reduce this effect was to re-calibrate the instrument whenever the instrument is in a condition called "Ball-Off condition", i.e. whenever there are no targets. By re-calibrating, adjustment is made so that the sensor is calibrated to the current testing conditions, including temperature. However, since this Ball-Off condition does not always occur, or occur frequently enough, the measurement could drift with temperature change without the knowledge of measurement taker or operator.

Another existing effort has been seen in patent U.S. Pat. No. 5,055,768 in which a temperature sensitive current source is deployed to solve the problem of Hall effect sensor sensitivity to temperature. This current source is intended to be part of the Hall effect sensor. However, the circuit as disclosed is limited to compensating temperature effects inside the Hall sensor residing on the same chip.

Yet another existing effort seen in U.S. Pat. No. 6,281,679 involves a system that uses a magnet and a Hall Effect sensor to measure distance. However, the magnets and the Hall sensor move in relation to each other. It teaches a method by which two Hall sensors are matched so that temperature is not a factor. It also addresses methods of regulating the temperature of the magnet and Hall sensors by auxiliary temperature control, including using circulated air. Yet, it failed to mention the challenge brought by and hence the solution to the issue of temperature variation between the locals of Hall probe and the processing circuit, which is located in the instrument.

U.S. Pat. No. 8,274,287 uses a magnet and a Hall sensor to detect disturbances in the field. It also employs a temperature sensor to control the temperature compensation of its measurement on quantity of metallic debris. However, the patent did not make use of the unique property and the subsequent advantages presented by Hall sensors' sensitivity to temperature. It did not make any effort in measuring changes of Hall sensors circuitry reading attributed to temperature change. In addition, it explicitly regards the temperature response as linear, which is not an accurate representation of this line of Hall sensor devices.

SUMMARY OF THE INVENTION

It is therefore a primary objective of the present disclosure to provide a Hall Effect instrument with the capability of compensating for temperature drift consistently, accurately and in real time of operation.

It is another objective of the present disclosure to accurately measure the Hall Effect sensor resistance via a four-point ohm meter circuit to track the effect of temperature on the Hall Effect sensor.

It is yet another objective of the present disclosure to provide a Hall Effect instrument configured to constantly measure the change in Hall sensor resistance due to change in temperature and to derive a relationship between the temperature and the compensation index on a per probe basis, which has exhibited a deterministic difference observed by the present inventor.

It is yet another objective of the present disclosure to provide a Hall Effect instrument configured to make compensation of the measurement result based on system-wide temperature changes, including temperature changes caused by locale distance between the Hall sensor and the magnets, the Hall sensor (Hall probe) the processing circuit (the instrument), etc.

DETAILED DESCRIPTION OF THE INVENTION

It should also be noted that some terms commonly used in the industry are interchangeably used in the present disclosure to denote the Hall effect sensor. For example, "Hall effect sensor", "Hall probe" and "Hall sensor", etc., all denote to the Hall effect sensor shown as 203 in FIG. 2. It should also be noted that "Hall effect instrument" or "Hall sensor instrument" denotes to the whole measurement system including the Hall probe, data acquisition circuitry and the whole logic and processing circuitry (not shown). Such variations in the usage of these terms do not affect the scope of the present disclosure.

Figure 1:
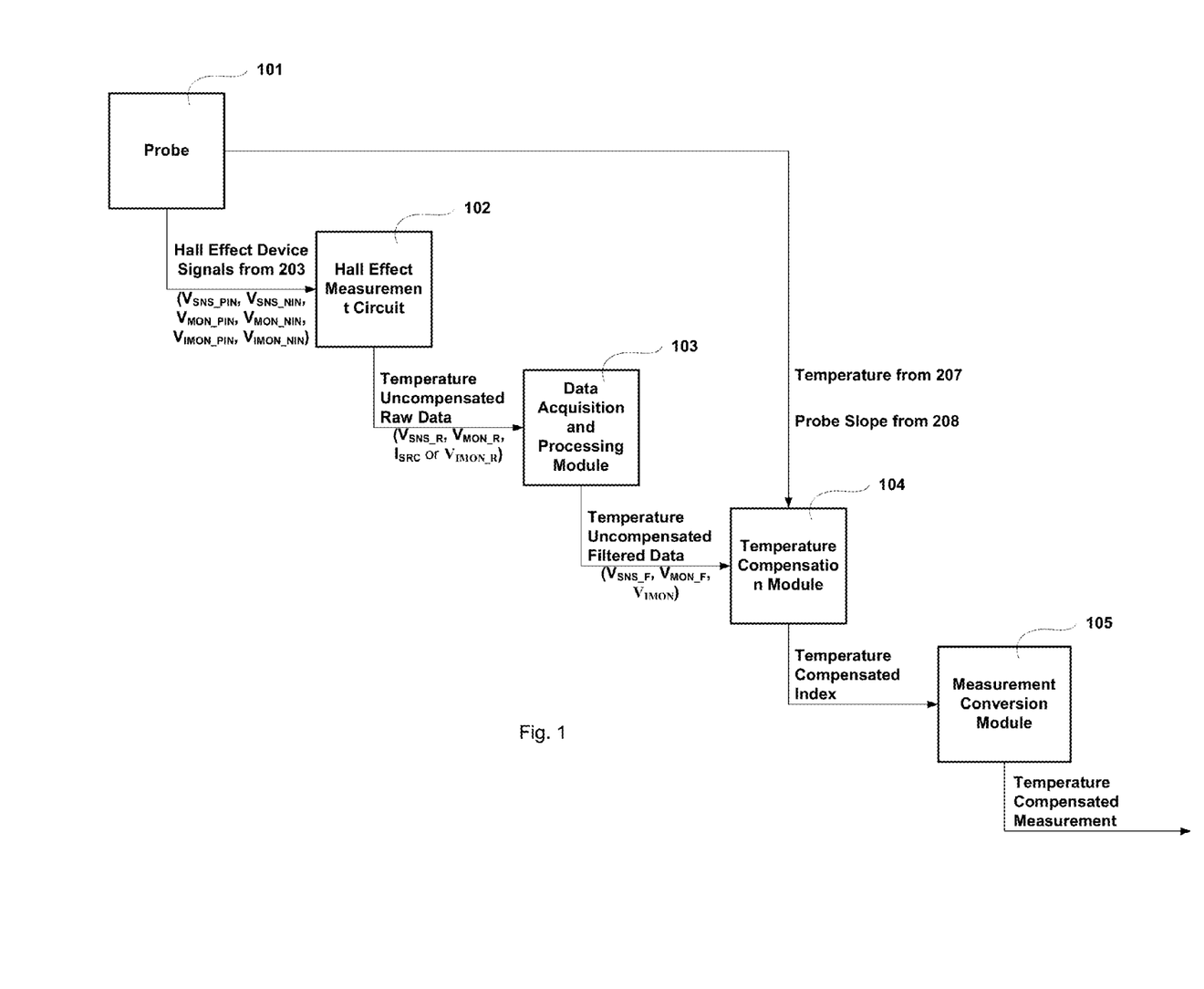
FIG. 1 is a block/flow diagram presenting the Hall Effect instrument with Temperature Compensation using a Four-Wire Ohm Meter Circuit technique according to present disclosure.

Referring to FIG. 1, a block diagram of the presently disclosed temperature compensated Hall Effect Sensor Measurement System using a Four-Wire Ohm Meter Circuit technique is presented. As can be seen the Hall sensor measurement system includes mainly five modules or five steps used for compensating measurement drift caused by the effect of changes of operational temperature. Each of the five modules is further elaborated to provide more details in subsequent figures.

According to FIG. 1, the Hall-Effect measurement instrument with temperature compensation in the present disclosure comprises a Hall sensor probe 101, a Hall Effect measurement circuit 102, a data acquisition and processing module 103, a temperature compensation module 104 and a measurement conversion module 105.

As can be seen in FIG. 1 that signals acquired by probe 101, including $V_{SNS\_PIN}$, $V_{MON\_PIN}$ and temperature at the probe are measured and fed into Hall Effect Measurement Circuit 102 which accurately captures three pairs of differential signals from the Hall Effect Sensor to produce the three Hall Effect Sensor Temperature Uncompensated Raw Data for the Data Acquisition and Processing Module, 103. The three pairs of differential signals including $V_{SNS\_PIN}$, $V_{MON\_PIN}$ are further elaborated in the subsequent description. Temperature uncompensated data is then sent to temperature compensation module 104 which operates to combine thermal stat temperature reading from probe 101 and probe slope from 208 (described later) and temperature compensation algorithm to produce Temperature Compensated Index. The Measurement Conversion Module, 105, then determines the correct Hall Effect measurement, such as corrected thickness, with the information from compensation module 104.

It should be appreciated that the temperature compensation function as novel aspect of the Hall instrument is largely carried out and executed concurrently with other normal operational functions of the Hall instrument, and can be built within the same components that otherwise serve other functions of the Hall sensor instrument. For instance, probe 101 both serves for Hall Effect measurement and temperature measurement with a temperature sensor 207. Data acquisition and processing module mainly serves the processing need for the Hall Effect measurement, and also provides the data processing need for temperature compensation as described in the present disclosure. In other words, the steps and or modules embodied in the present disclosure can largely co-use hardware components of the Hall effect instrument that are designed for the main purpose of the Hall Effect measurement, i.e., thickness measurement.

It should also be appreciated that any of the steps or modules shown in FIG. 1 can alternatively resides in and be executed by other stand-alone or add-on components so that the method of temperature compensation on Hall Effect measurement can be used in combination of existing Hall Effect instrument. The alternatively devised add-on components are also within the framework of the present disclosure.

Figure 2:
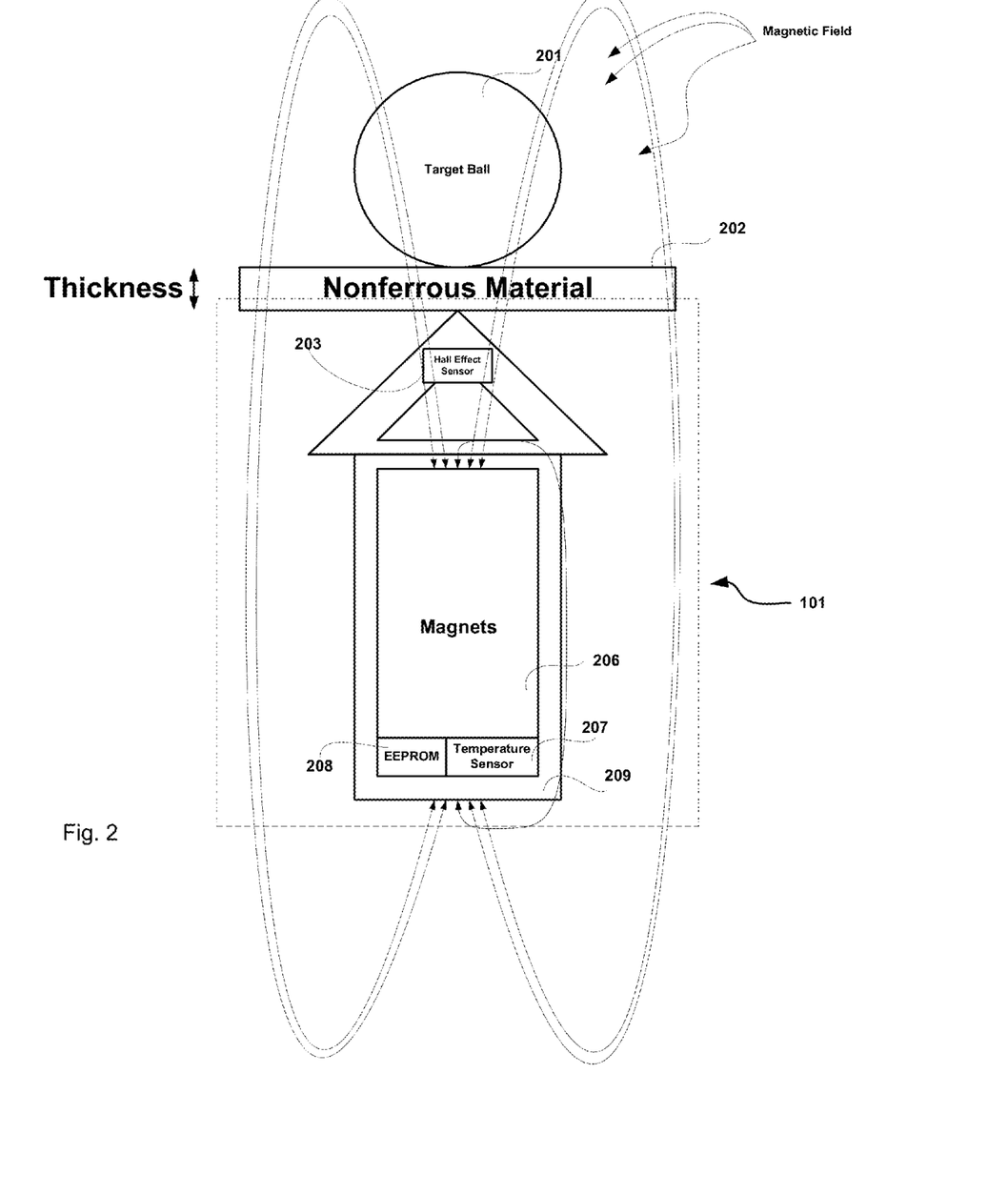
FIG. 2 is schematic diagram depicting the components of Probe (101) for thickness measurement embodying a temperature sensor according to the present disclosure.

Reference now is turned to FIG. 2. According to FIG. 2, the Hall measurement system firstly embodies a probe, 101. Probe 101 further comprises a Hall Effect sensor, 203, magnets, 206 providing the primary magnetic field source, a temperature sensor, 207, an electrical erasable type of memory device such as an EEPROM, 208 and the probe casing, 209.

A thickness measurement is taken by placing probe, 101, between a nonferrous material to be measured and a target ball, 201. Hall Effect sensor, 203, measures the magnetic field between target ball, 201, and probe, 101. Magnets, 206, encased in the probe casing, 209, generate a magnetic field between the probe and the target ball. This magnetic field is detected by Hall Effect sensor 203. It then sends the Hall Effect sensor measurement signals, the Probe Slope (described later) from the EEPROM, 208, and the temperature from temperature sensor, 207, into the data processing circuitry of the measurement system residing on the instrument for further processing.

In addition, temperature sensor 207 provides the temperature of the magnets, Tmag, for temperature compensation module 104. Lastly, probe 101 uses memory EEPROM 208 to record the probe specific information, such as the Probe Slope (described later) used in the Temperature Compensation Module 104 and other probe identification parameters common to existing practice. How the Probe Slope was derived is subsequently explained in relation to FIGS. 7a and 7b.

Figure 3A:
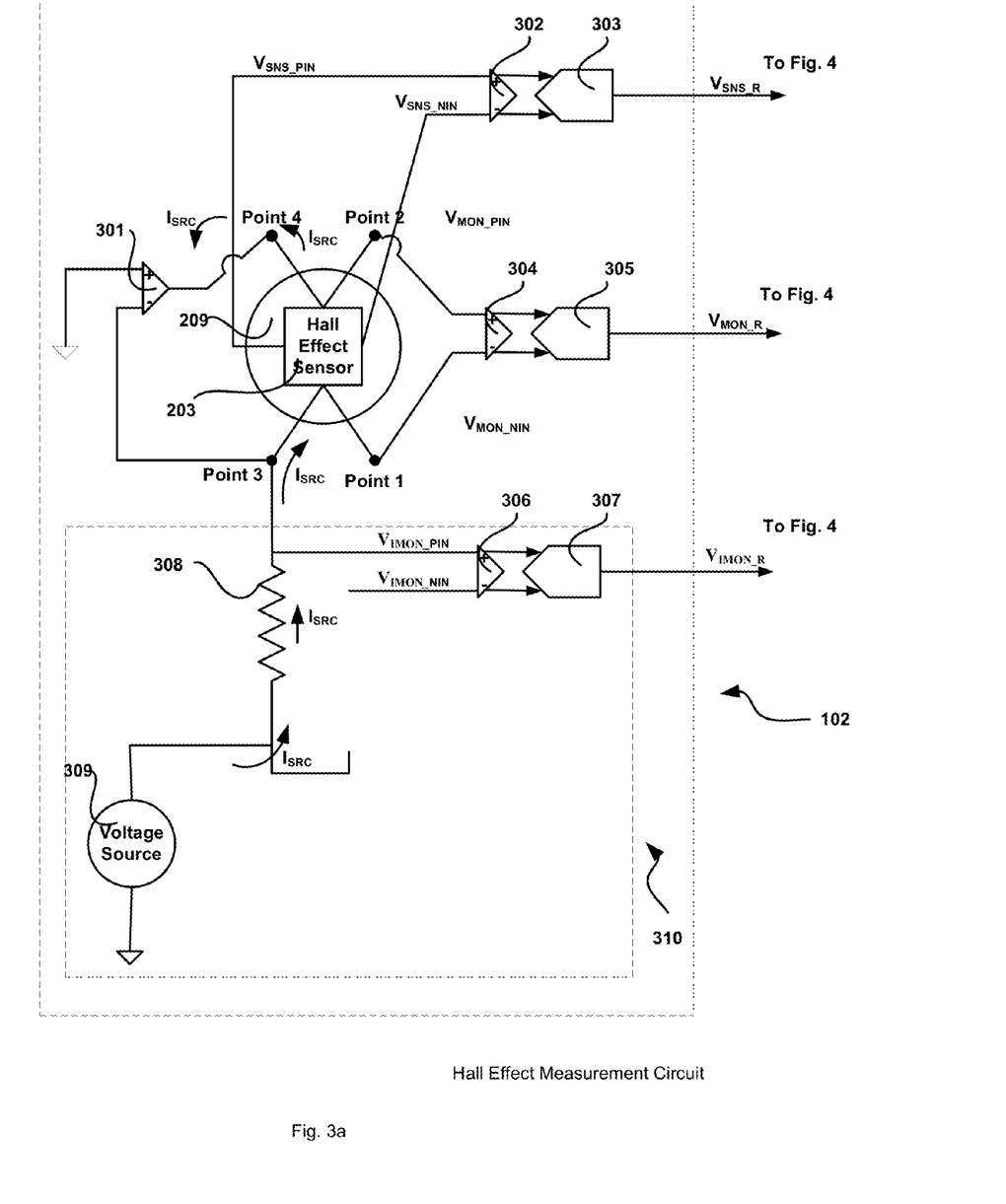
FIGS. 3a and 3b are schematic circuit diagrams depicting the two-wire or four-wire Ohm Meter Circuit, respectively, used in the present disclosure to accurately measure the Hall Effect sensor resistance, which is highly sensitive to temperature change.
Figure 3B:
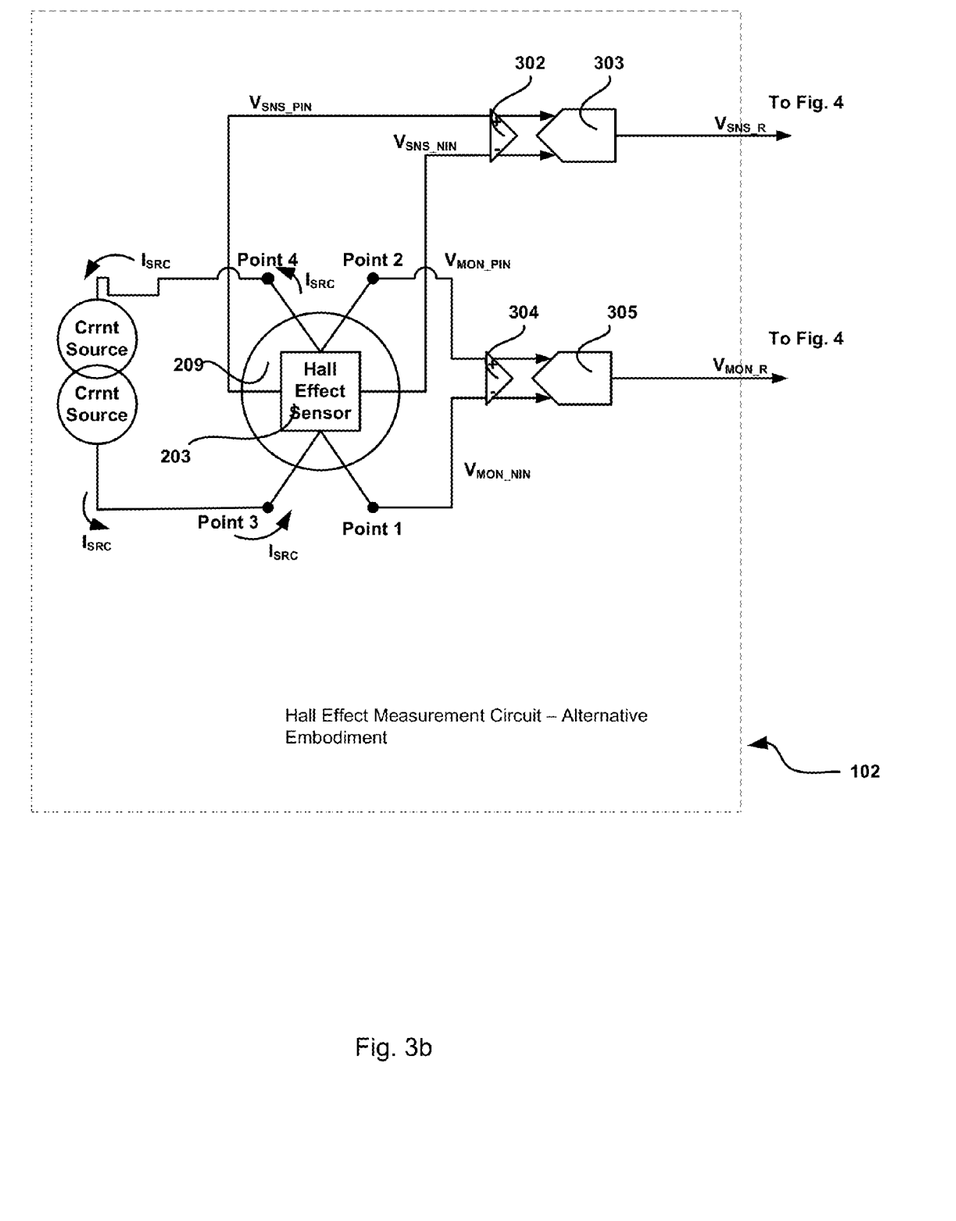

Referring to FIGS. 3a and 3b, Hall Effect Measurement Circuit 102 can be devised with two alternative embodiments, one detailed as using a Four-Wire Ohm Meter with a drive current monitoring circuit 310 in FIG. 3a; the other as using a Four-wire Ohm meter with a constant current source $I_{SRC}$ (without circuit 310) in FIG. 3b.

According to FIG. 3a, the Hall Effect measurement circuit 102 embodies a sub-circuit similar to that of four-wire ohm meter and drive current monitoring circuit 310. Circuit 102 further embodies components producing three pairs of differential Hall Effect Sensor signals which are accurately measured to produce three Temperature Uncompensated Raw Data for Data Acquisition and Processing Module 103. The Hall Effect Sensor 203 via Hall Effect measurement circuit, 102, as shown in FIG. 3a, produces three pairs of differential signals for further processing.

The three differential pairs of Hall Effect Sensor signals are defined as:

a. $V_{SNS\_PIN}$—Positive Hall Effect Sense Voltage—positive differential input to amplifier, 302;

b. $V_{SNS\_NIN}$—Negative Hall Effect Sense Voltage—negative differential input to Amplifier, 302;

c. $V_{MON\_PIN}$—Positive Hall Effect Monitor Voltage—positive differential input to Amplifier, 304;

d. $V_{MON\_NIN}$—Negative Hall Effect Monitor Voltage—negative differential input to Amplifier, 304;

e. $V_{IMON\_PIN}$—Positive Hall Effect Voltage modulated with current stability, $V_{IMON}$—positive differential input to Amplifier, 306;

f. $V_{IMON\_PIN}$—Negative Hall Effect voltage modulated with current stability, $V_{IMON}$—negative differential input to Amplifier, 306.

Continuing to the right-hand side of FIG. 3a, the Hall Effect measurement circuit 102 produces three Temperature Uncompensated Raw Data outputs are defined as:

g. $V_{SNS\_R}$—Hall Effect Raw Digital Sense Voltage—digital output from the Analog to Digital Converter, 303;

h. $V_{MON\_R}$—Hall Effect Raw Digital Monitor Voltage—digital output from the Analog to Digital Converter, 305;

i. $V_{IMON\_R}$—Hall Effect Raw Digital voltage modulated for current stability, $V_{IMOD}$,—digital output from the Analog to Digital Converter, 307.

It should be noted that the Hall Effect measurement circuit includes a sub-circuit that happens to be the same as that used in the existing practice involving Four Wire Ohm Meter. One of the novel aspects of the present disclosure is to repurpose the four-wire circuit for Hall Effect measurement. The temperature compensation aspect of the operation also uses the signals retrieved from the four-wire circuit. It can therefore be understood that the four-wire ohmmeter itself had existed in prior practice. However, the use of such circuit for Hall Effect measurement, thickness measurement and for further making temperature compensation of such measurements are considered novel by the present disclosure.

Still referring to FIG. 3a, the methodology involved in the usage of Hall Effect measurement circuit 102 is herein described. Starting at the lower left-hand corner of FIG. 3a, a constant voltage source, 309, is used to provide a constant current, $I_{SRC}$, that goes across the resistor, 308. This constant current, $I_{SRC}$, is the same constant current that goes across the Hall Effect Sensor from Point 3 to Point 4. The constant current, $I_{SRC}$, continues and sinks into the amplifier, 301. A constant current, $I_{SRC}$, is provided across the Hall Effect Sensor and a Kelvin connection at Points 1 and 2 are made to ensure proper and accurate measurement of a resistor.

With the accurate measurement of the Hall Effect Sensor resistance by measuring the voltage across Points 1 and 2, we have $V_{MON\_PIN}$ and $V_{MON\_NIN}$. These two differential signals, $V_{MON\_PIN}$ and $V_{MON\_NIN}$, can be measured by connecting them to a differential amplifier, 304, followed by an Analog to Digital Converter, 305. The resultant digital signal, $V_{MON\_R}$, represents the voltage across the Hall Effect Sensor.

Continuing with FIG. 3a, by Ohm's Law, the resistance of the Hall Effect Sensor can be expressed as $V_{MON\_R}/I_{SRC}$. Since $I_{SRC}$ is a constant current, then $V_{MON\_R}$ is proportional to the resistance of the Hall Effect Sensor. Since the resistance of the Hall Effect Sensor is also proportional to temperature, we now have a measurement, $V_{MON\_R}$, which is proportional to temperature. This is one of several signals used to compensate measurement due to temperature drift.

Similarly, the Hall Effect Sensor Voltage, $V_{SNS\_R}$, via the differential signals, $V_{SNS\_PIN}$ and $V_{SNS\_NIN}$, are measured via amplifier, 302, and Analog to Digital Converter, 303, to produce $V_{SNS\_R}$.

And the constant current, $I_{SRC}$, via $V_{IMOD\_PIN}$ and $V_{IMON\_NIN}$ are measured by amplifier, 306, and Analog to Digital Converter, 307, to produce $V_{IMOD\_R}$.

Lastly $V_{MON\_R}$, $V_{SNS\_R}$, $V_{IMOD\_R}$, as well as temperature of the magnets and Probe Slope (later described) can be used to further determine how to compensate for temperature drift.

Reference is now made to FIG. 3b. An alternative implementation can be viewed by substituting another design for FIG. 3a. As for the embodiment shown in FIG. 3a, the origin of $V_{IMOD\_R}$ is the voltage across resistor 308. In this way $VIMOD_R$ monitors the performance of the constant current drive circuit. Components 301, 308 and 309 make a constant current source used to drive a current through the Hall Effect sensor 203. If the Voltage Source 309 changes for any reason, $V_{IMOD\_R}$ will detect this and be used to compensate for the matching changes in Vmon and Vsns.

It should be noted that voltage source 309 can be an AC or DC source, bearing in mind that drive current monitoring circuit 310 is effective when AC is used.

Considering as the compensation the voltage source 309 does not need to be extremely stable for excellent instrument performance. Therefore, $V_{IMOD}$ is used to compensate or performance limitations of circuits inside the gage only in this preferred embodiment shown in FIG. 3a. $V_{IMOD}$ does not compensate the probe. In other words, $V_{IMOD}$ is not a must needed component in order for the system in the present disclosure to function as intended. It should be appreciated that with or without the usage of $V_{IMOD}$ and its associated components are all within the scope of the present disclosure.

As an example, referring to FIG. 3b, an alternative embodiment is shown to be without $V_{IMOD}$. A constant current source forcing a current Isrc through the Hall device 209 Point 3 to Point 4. It should be noted that when referring to FIG. 3b as a replacement for FIG. 3a, the value Isrc can be used to substitute the use of $V_{IMOD}$ in the subsequent implementations. In this regard, Isrc can be assumed as a constant, which in an exemplary case, to be about 1 mA.

Figure 4:
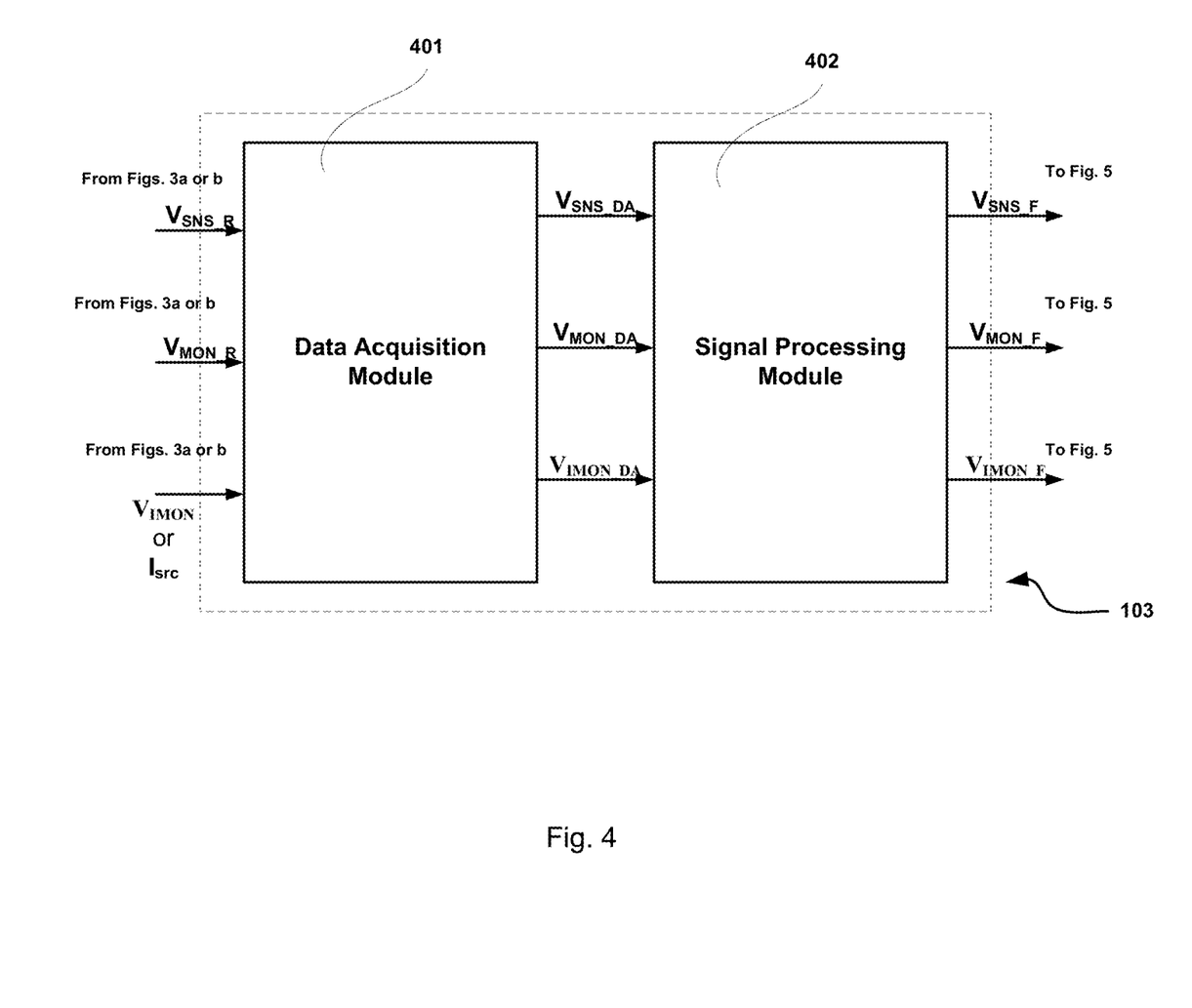
FIG. 4 is a flowchart depicting a Data Acquisition and Processing Module (103). It shows how the measurements taken from the Hall Effect Sensor (203) are acquired and processed before the measurements are used for temperature compensation.

Reference is now turned to FIG. 4 which presents a more detailed diagram of the Data Acquisition and Processing Module, 103. This module, Data Acquisition and Processing Module, 103, further comprises two modules: Data Acquisition Module, 401, and the Signal Processing Module, 402. The Data Acquisition Module takes in the three inputs, $V_{MON\_R}$, $V_{SNS\_R}$, $V_{IMON\_R}$ or Isrc from circuits shown in FIGS. 3a and 3b, and through a magnitude detection circuit, produces three signals, $V_{MON\_D4}$, $V_{SNS\_D4}$, and $I_{D4}$. In FIG. 4, the three temperature Uncompensated Raw Data from circuits shown in FIGS. 3a and 3b are acquired and processed to produce the three temperature Uncompensated Filtered Data for the temperature Compensation Module, 104.

Three signals, $V_{MON\_D4}$, $V_{SNS\_D4}$, $I_{D4}$, would then go to the Signal Processing Module, 402, where they get filtered to produce three final signal magnitudes, $V_{MON\_F}$, $V_{SNS\_F}$, and $V_{IMON\_F}$, for the next stage, Temperature Compensation Module, 104.

The three Temperature Uncompensated Filtered Data outputs are defined as:

j. $V_{SNS\_F}$—Hall Effect Filtered Digital Sense Voltage—filtered output from the Signal Processing Module, 402;

k. $V_{MON\_F}$—Hall Effect Filtered Digital Monitor Voltage—filtered output from the Signal Processing Module, 402;

l. $V_{IMON\_F}$—Hall Effect Filtered Digital $V_{IMOD}$ Voltage modulated with current stability—filtered output from the Signal Processing Module, 402.

Figure 5:
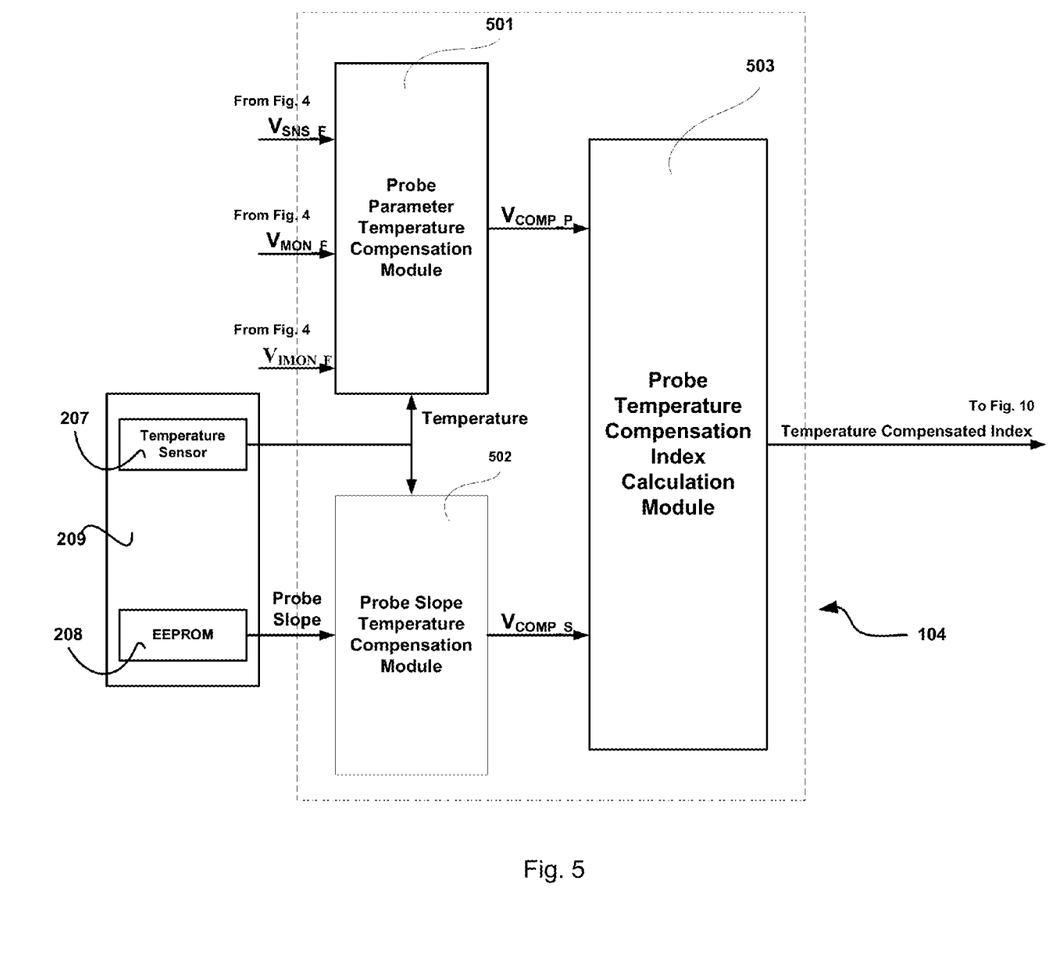
FIG. 5 is a flowchart elaborating Temperature Compensation Module (104). It further comprises three modules, one for probe parameter compensation and one for slope compensation and the third module for calculating the Temperature Compensation Index.

Reference is now made to FIG. 5 with a more detailed diagram of the Temperature Compensation Module, 104 of FIG. 1. Temperature Compensation Module, 104, further comprises three modules: Probe Parameter Temperature Compensation Module, 501, Probe Slope Temperature Compensation Module, 502, and Probe Temperature Compensation Index Calculation Module, 503. In this stage, the three Temperature Uncompensated Filtered Data, along with the magnet temperature reading from the Temperature Sensor, 207, and the Probe Slope from the EEPROM, 208, are used to calculate the Temperature Compensated Index.

The Probe Parameter Temperature Compensation Module, 501, receives four inputs: $V_{MON\_F}$, $V_{SNS\_F}$, and $V_{IMON\_F}$ from 103 and Temperature from 207, Tmag. This module, 501, then produces a first compensation factor $V_{COMP\_P}$. For more details, please see FIG. 6

Probe Slope Temperature Compensation Module, 502, receives two inputs: Temperature from 207, Tmag, and Probe Slope from 208. This module, 502, then produces a second compensation factor $V_{COMP\_S}$. For more details, please see FIG. 8.

Probe Temperature Compensation Index Calculation Module, 503, receives two inputs: $V_{COMP\_P}$ and $V_{COMP\_S}$. This module, 503, then produces Temperature Compensated Index. For more details, please see FIG. 9.

Figure 6:
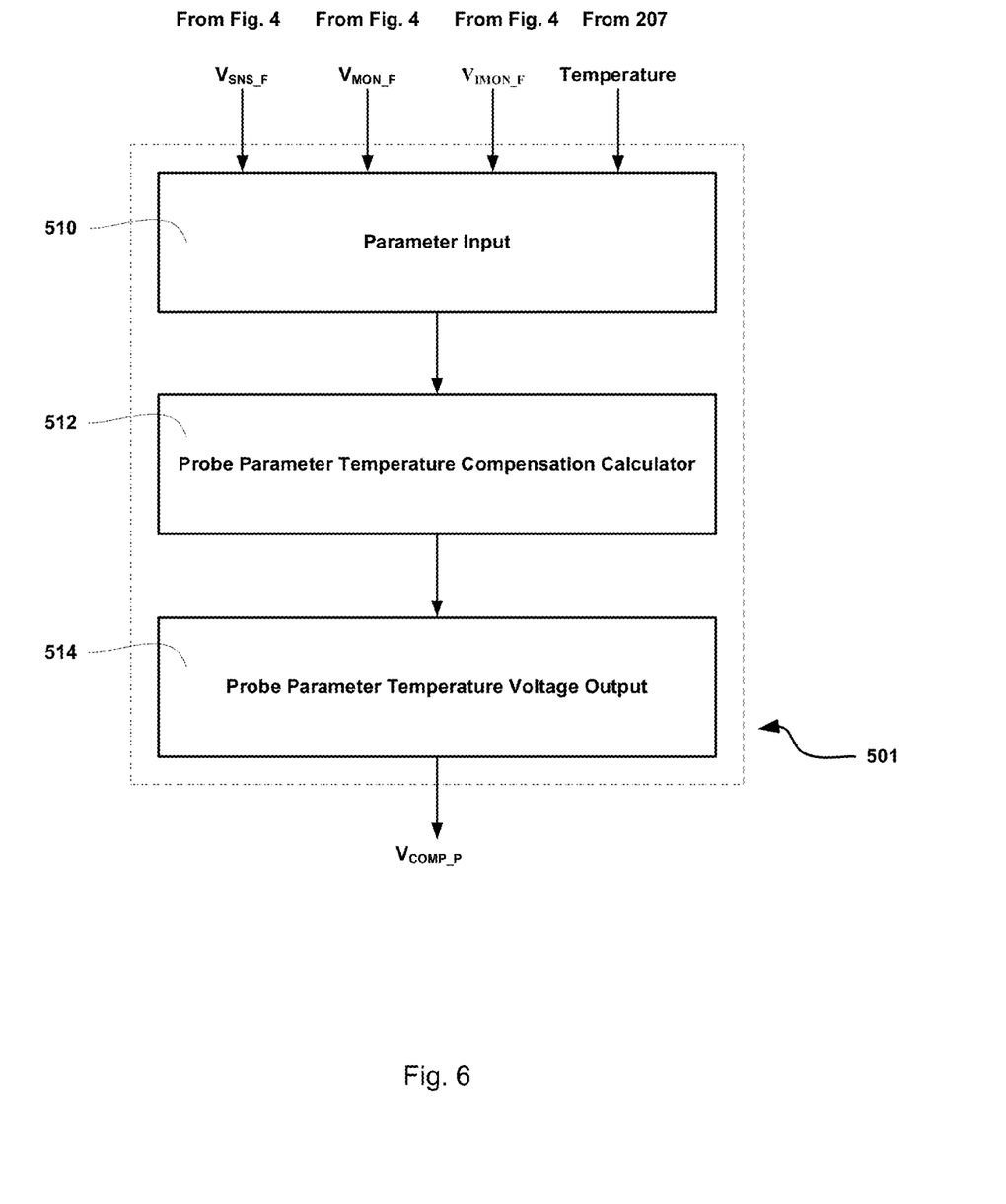
FIG. 6 is a flowchart depicting how the Probe Parameter Temperature Compensation Module (501) calculates probe parameter temperature compensation, voltage, $V_{COMP\_P}$.

Referring now to FIG. 6, a more detailed diagram of the Probe Parameter Temperature Compensation Module, 501 of FIG. 5 is presented. The four inputs, $V_{MON\_F}$, $V_{SNS\_F}$, and $V_{IMON\_F}$ from 103 and Tmag from 207 are received through Parameter Input, 510, and sent to the Probe Parameter Temperature Compensation Calculator, 512, which produces the product of Probe Parameter Temperature Compensation Module 501. As can be seen below, Probe parameter Temperature Compensation Calculator 512 can be configured to carry out calculations in one of the following two equations, Eq. 1 or Eq. 2.

$$V_{COMP\_P} = V_{SNS\_F} + V_{MON\_F}*(\alpha + V_{SNS\_F}*\beta) + Tmag*(\gamma + V_{SNS\_F}*\delta) \qquad \text{Eq. 1}$$

wherein,

Tmag is the temperature from the Temperature Sensor 207;

$\alpha$, $\beta$, $\gamma$ and $\delta$ are constants based upon the manufacturing tolerances of probe 101. They can be obtained by those skilled in the art according to Eq. 1, and empirical data from conducting experiments on the probe of each probe type, yielding readings of the $V_{SNS\_F}$, $V_{MON\_F}$, $I_{SRC}$ from the corresponding Four-Wire ohmmeter and the temperature reading, $T_{mag}$ for the probe.

Once $V_{COMP\_P}$ is calculated, it goes through the Probe Parameter Temperature Voltage Output, 514, and is sent to the Probe Temperature Compensation Index Calculation Module, 503 of FIG. 5.

As can be seen, the temperature compensation calculation according to Eq. 1 reflects temperature changes both in Hall sensor, through reading $V_{MON\_F}$ and $V_{SNS\_F}$, and near magnets, through Tmag.

It should be noted that in Eq. 1, it is assumed that $I_{SRC}$ is a constant and the factor represented by $V_{IMON\_R}$ is not reflected in it. Therefore Eq. 1 is suitable to be used for embodiment presented associated to FIG. 3b, wherein the embodiment shown in FIG. 3a does not include a sub-circuit for monitoring the stability of $I_{SRC}$.

It should be noted in connection to FIG. 3a that $V_{IMON\_F}$ is used to monitor how stable the constant current, $I_{SRC}$, is and to factor in the stability of $I_{SRC}$ into the temperature compensation.

For the embodiment of the measurement circuit 310 with voltage source monitoring (FIG. 3a), $$V_{COMP\_P} = (((V_{SNS\_F}) + ((V_{MON\_F} - V_{IMON\_F})*A) + (((V_{MON\_F} - V_{IMON\_F})*(V_{SNS\_F})*B)/(V_{IMON\_F})) + ((Tmag-22)*(V_{IMON\_F})*C) + ((Tmag-22)*(V_{SNS\_F})*D))/(V_{IMON\_F})) \qquad \text{Eq. 2}$$

wherein there are six major contributing parts to $V_{COMP\_P}$:

i) $V_{SNS\_F}$ is the factor involving the Hall Effect Filtered Digital Sense Voltage;

ii) $((V_{MON\_F} - V_{IMON\_F})*A)$ provides temperature compensation based on the Hall sensor temperature as indicated by $V_{MON\_F}$, with coefficient A modulating the magnitude of this portion of the temperature compensation, which is intended to correct the "ball-off" situation, but has an equal impact on "ball-on" situation;

iii) $((V_{MON\_F} - V_{IMON\_F})*(V_{SNS\_F})*B)/(V_{IMON\_F}))$ is a scalar temperature compensation factor based on the Hall sensor temperature as indicated by $V_{MON\_F}$, and wherein coefficient B modulates the amount of correction, which is intended to correct the ball-off situation and accounts for manufacturing tolerances of the Probe and Hall Effect Sensor;

iv) $((Tmag-22)*(V_{IMON\_F})*C)$ provides offset temperature compensation based on the magnet temperature as indicated by Tmag, and wherein C is the factor involving the Tmag from Temperature Sensor 207 and accounts for the specific probe manufacturing tolerances;

v) $((Tmag-22)*(V_{SNS\_F})*D)$ provides scalar temperature compensation based on the magnet temperature as indicated by Tmag, and wherein D is a factor involving the Tmag from Temperature Sensor 207 and accounts for the specific probe manufacturing tolerances.

It should be noted that reference temperature herein used in the equation (22° C.) is an exemplary ambient temperature. Different values can be used when calibration is done differently.

A, B, C and D are constants based upon the manufacturing tolerances of probe 101. They can be obtained by those skilled in the art according to Eq. 2, and empirical data from conducting experiments on the probe of each probe type, yielding readings of the $V_{SNS\_F}$, $V_{MON\_F}$, $V_{IMON\_F}$ from the corresponding Four-Wire ohmmeter and the temperature reading, $T_{mag}$ for the probe used in the experiment.

Once the $V_{COMP\_P}$, is calculated, it goes through the Probe Parameter Temperature Voltage Output, 514, and is sent to the Probe Temperature Compensation Index Calculation Module, 503.

Again it can be noted that Eq. 1 compensates measurement inaccuracies due to temperature drift quite well without using the factor related to $V_{IMON\_F}$. $V_{IMON\_F}$ is used solely to monitor how stable the constant current $I_{SCR}$ is.

Eq. 2 provides better temperature compensation taking into account when $I_{SCR}$ varies. In addition, measurement variation due to interdependencies between the four inputs ($V_{SNS\_F}$, $V_{MON\_F}$, $V_{IMON\_F}$, Temperature) are compensated via factors ii) through v).

Figure 7:
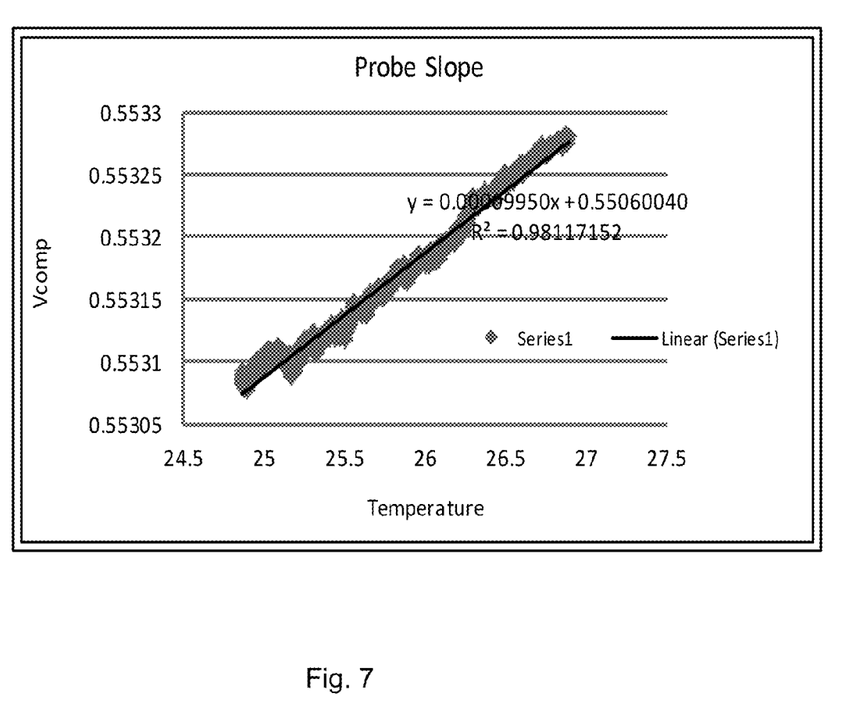
FIG. 7 is a graph showing relationship of $V_{COMP}$ versus Temperature, which is used to determine the temperature compensation slope for the exemplary probe.

Reference is now made to FIG. 7 which present a methodology herein employed to determine the per probe relationship between Temperature and $V_{COMP}$ slope called $V_{COMP\_S}$.

FIG. 7 represents an exemplary probe-specific slope drawing by using experimental data from a case collected from the probe for various temperature settings. The exemplary Hall Effect measurement circuit for the specific probe as shown in FIG. 3a is measured with various temperatures. $V_{MON\_F}$, $V_{SNS\_F}$ and $V_{IMON\_F}$ are drawn from the measurement and $V_{COMP\_P}$ is calculated by using Eq. 2. FIG. 7 is then plotted representing the relationship between Tmag and $V_{COMP\_P}$.

Figure 8:
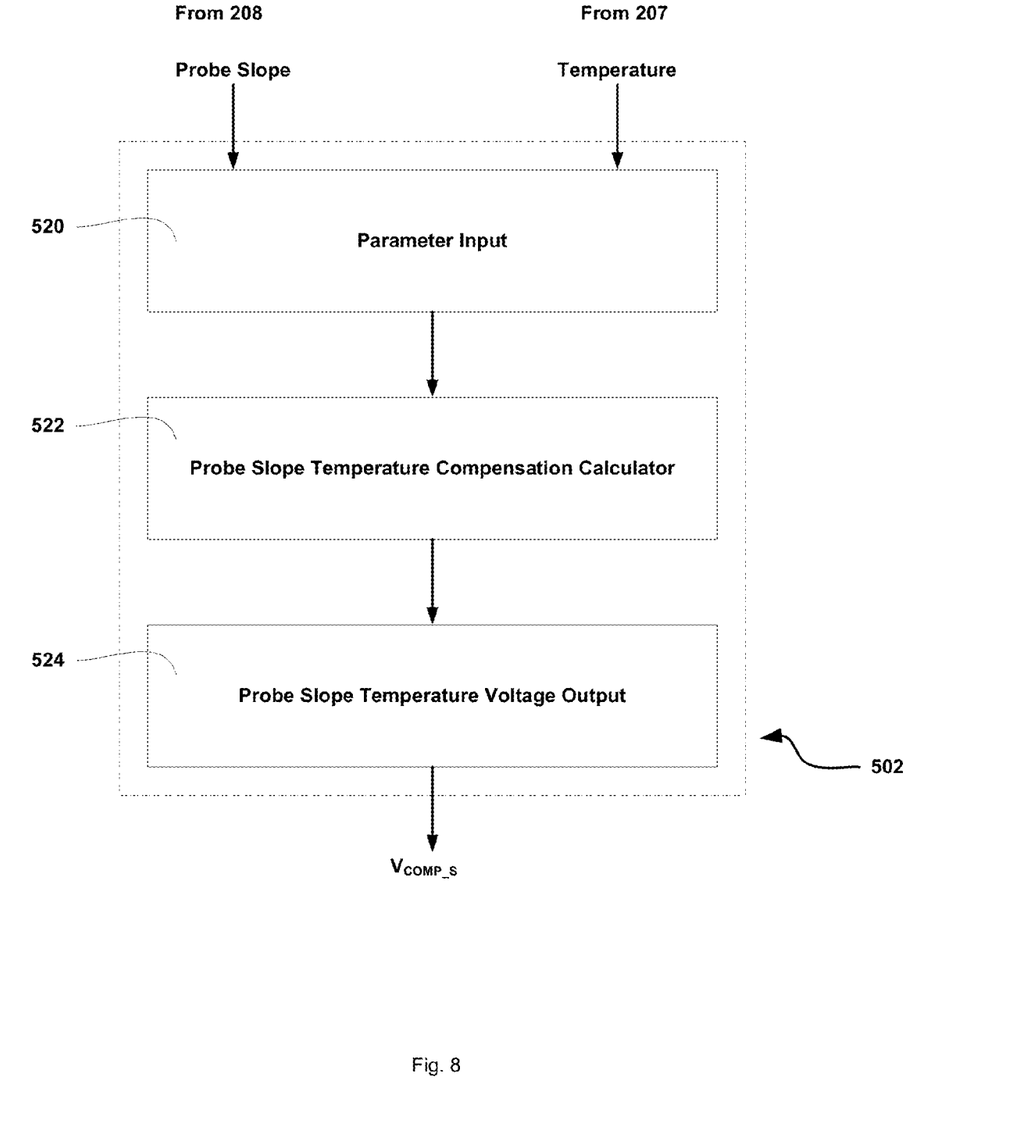
FIG. 8 is a flow chart depicting the Probe Slope Temperature Compensation Module (502) calculating probe slope temperature compensation voltage, $V_{COMP\_S}$.

The Probe Slope derived from the experimental data graph similar to FIG. 7 using a linear curve fit is stored in the EEPROM, 208, to be retrieved for FIG. 8.

FIG. 8 presents a more detailed diagram of the Probe Slope Temperature Compensation Module, 502.

In parallel to the calculation of $V_{COMP\_P}$, $V_{COMP\_S}$ is calculated in this module. The Probe Slope, from the EEPROM, 208, and the magnet's temperature from the Temperature Sensor, 207, are received through the Parameter Input, 520, and sent to the Probe Slope Temperature Compensation Calculator, 522. The calculator used is in the following format:

$$V_{COMP\_S} = \text{Probe Slope} * (T\text{mag} - \text{Reference Temperature}) \qquad \text{Eq. 3}$$

where $V_{COMP\_S}$ adjusts the overall $V_{COMP}$ based upon the probe's response to magnet's temperature.

Once $V_{COMP\_S}$ is calculated, it goes through the Probe Slope Temperature Voltage Output, 524, and is sent to the Probe Temperature Compensation Index Calculation Module, 503.

Figure 9:
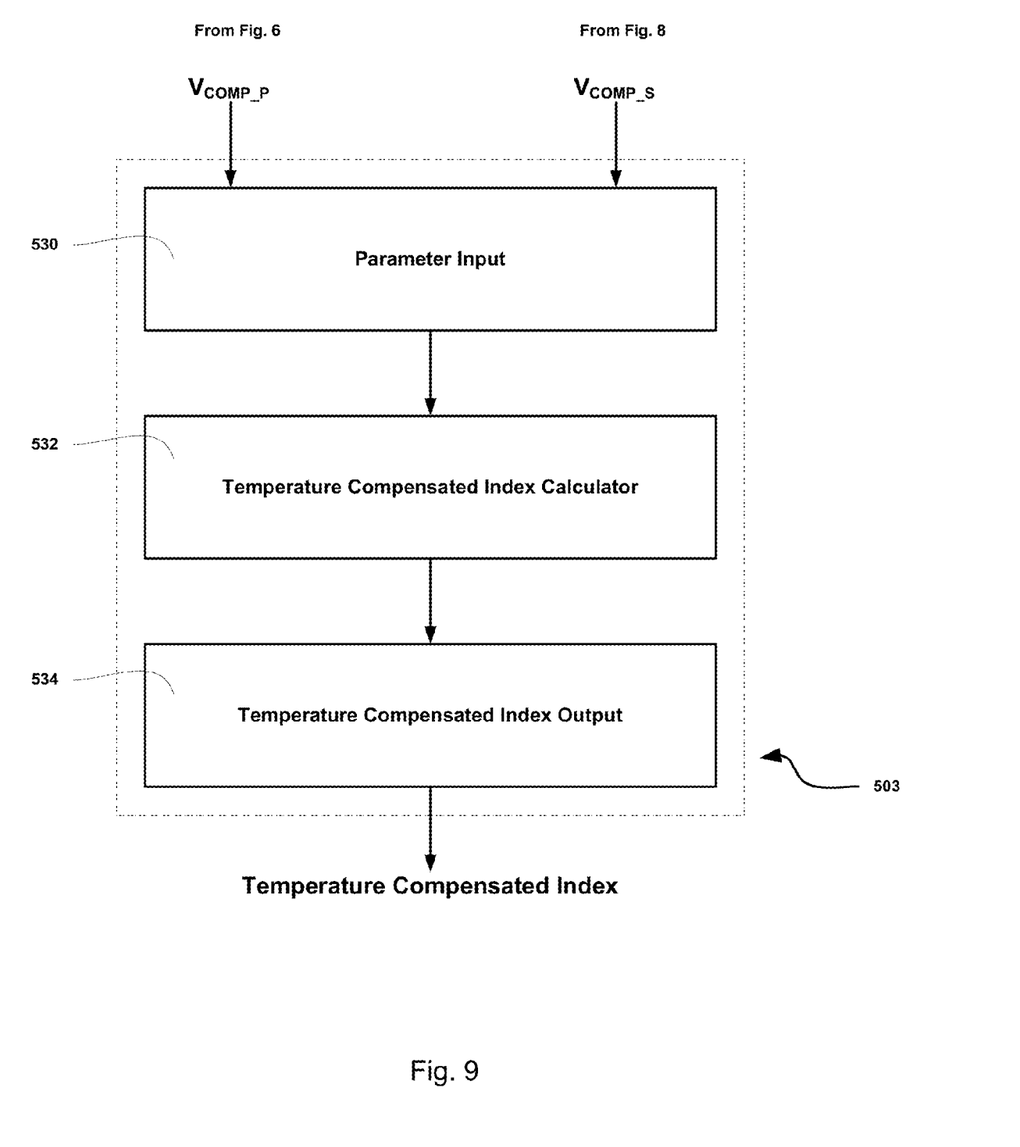
FIG. 9 is yet another flow chart representing how the Probe Temperature Compensation Index Calculation Module (503) calculates the Temperature Compensated Index.

FIG. 9 presents a more detailed diagram of the Probe Temperature Compensation Index Calculation Module, 503.

The $V_{COMP\_P}$ from 501 and $V_{COMP\_S}$ from 502 are received through the Parameter Input, 530, and sent to the Temperature Compensated Index Calculator, 532. The calculator used is in the following format:

$$\text{Temperature Compensation Index} = V_{COMP\_P} - V_{COMP\_S} \qquad \text{Eq. 4}$$

Once the Temperature Compensated Index is calculated, it goes through the Temperature Compensated Index Output, 534, and is sent to the Measurement Conversion Module, 105.

Figure 10:
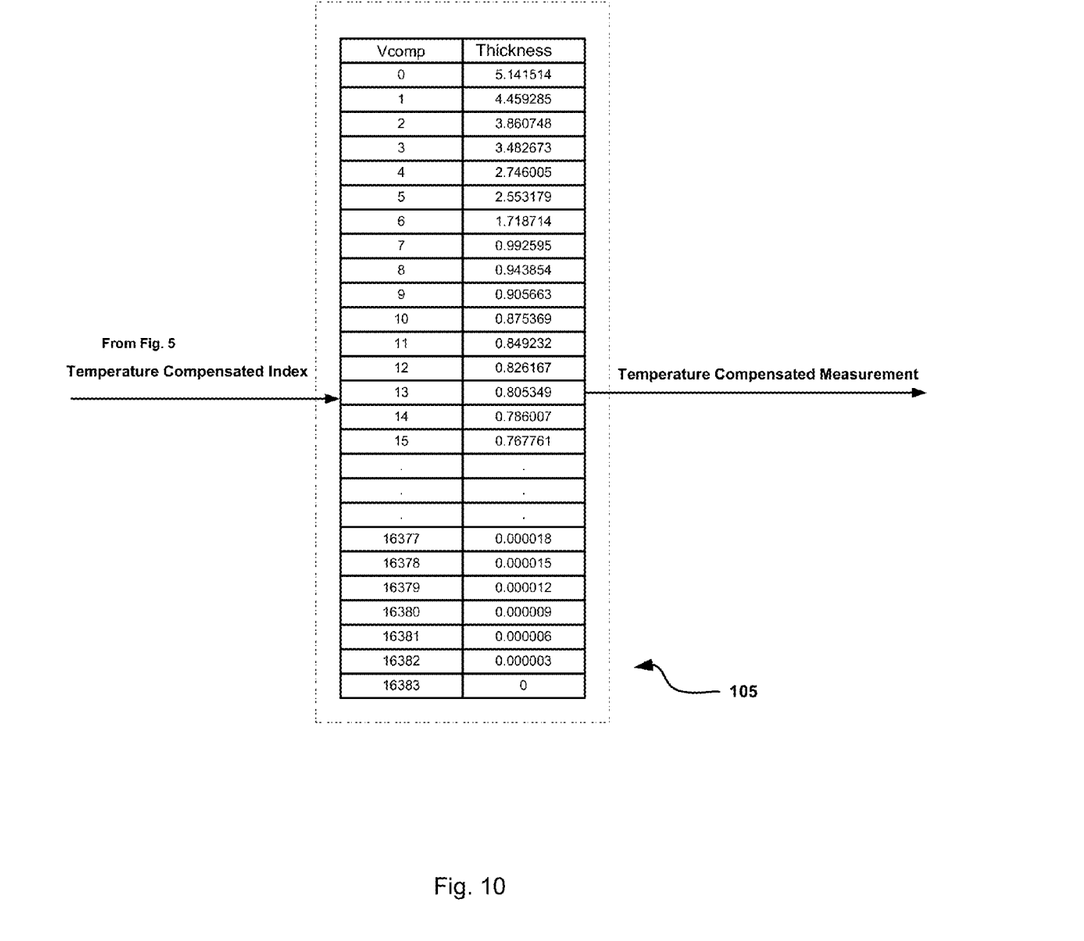
FIG. 10 is a flow chart depicting steps through which the Temperature Compensated Measurement is determined from the Temperature Compensated Index.

At last, FIG. 10 provides a more detailed exhibit of the Measurement Conversion Module, 105 showing how the temperature compensated thickness measurement is converted from Temperature Compensated Index. In order to use the temperature compensated index $V_{comp}$ (right column in FIG. 10) for a specific probe, a specific target is used in experiments to derive measured thickness at the reference ambient temperature (22° C.).

Temperature Compensated Index, or compensated Hall Effect reading $V_{comp}$ is then fed into the Measurement Conversion Module 105 and converted by a probe-target specific conversion, such as shown in FIG. 10. It is known to those skilled in the art to obtain empirical data between Hall Effect reading and thickness measurement for any specific set of probe and target. The novel aspect of the invention herein presented is that the effect of temperature change to Hall Effect reading is compensated and presented as "compensated index $V_{comp}$". The temperature compensated or corrected measurement (thickness) is therefrom accurately produced. In the exemplary conversion used in FIG. 10, Temperature Compensated Index $V_{comp}$ is provided to measurement conversion module 105. Based on the $V_{comp}$ and through linearly interpolation, an accurate measurement is produced by the conversion module 105.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. An instrument measuring Hall Effect of at least one Hall sensor magnetically coupled with a target during a measurement session, comprising:
    a probe including the Hall sensor, a magnetic field source and a temperature sensor configured to provide a probe temperature reading on or at a very close proximity of the magnetic field source;
    a data processing and display console coupled with the probe at a predetermined distance with an electronic coupling means, the console further comprising,
    a Hall Effect measurement circuit connected with the Hall sensor via the coupling means, the Hall Effect measurement circuitry further including at least partially a Four-Wire Ohm Meter circuit, which captures at least two pairs of differential signals from the Hall Effect sensor,
    a data acquisition and processing module configured to receive signals from the Hall Effect measurement circuit and provide at least two pairs of uncompensated raw based on the differential signals;
    a temperature compensation module configured to compute based on the at least two pairs of uncompensated raw data and the temperature reading and a probe slope associated with the probe to produce a temperature compensation index;
    a measurement conversion module configured to provide a corrected Hall Effect measurement data by correcting the raw signal data using information corresponding to the temperature compensation index.

2. The instrument of claim 1 further comprises an electronic erasable memory for storing specific information in the probe.

3. The instrument of claim 1 is configured to measure thickness according to the strength of the Hall Effect measurement.

4. The instrument of claim 1, wherein the compensation index is a result of dynamically compensating the Hall Effect measurement of the probe with the temperature change in the Hall sensor and/or at the magnetic source.

5. The instrument of claim 1, wherein the two pairs of the uncompensated raw data, including raw Hall Effect Sense Voltage, $V_{SNS\_R}$ and raw Hall Effect Monitor Voltage, $V_{MON\_R}$, respectively, wherein $V_{SNS\_R}$ and $V_{MON\_R}$ is each fed to the data acquisition and processing module.

6. The instrument of claim 5 wherein the data acquisition and processing module further comprises a data acquisition module and a signal processing module, wherein the signal processing module producing Hall Effect filtered digital sense voltage $V_{SNS\_R}$ from the $V_{SNS\_R}$ and filtered digital monitor voltage $V_{MON\_F}$ from the $V_{MON\_R}$.

7. The instrument of claim 6 wherein the temperature compensation module further comprises a probe parameter temperature compensation module producing a first compensating factor $V_{COMP\_P}$, a probe slope temperature compensation module producing a second compensation factor $V_{COMP\_S}$ and a probe temperature compensation index calculation module producing a temperature compensation index $V_{COMP}$.

8. The instrument of claim 7, wherein the Hall Effect measurement circuitry further comprises a voltage source providing substantially constant current source $I_{SRC}$ to the Four-Wire Ohm Meter circuit.

9. The instrument of claim 8, wherein the probe parameter temperature compensation module further comprises probe parameter temperature compensation calculator producing the factor $V_{COMP\_P}$ substantially according to the following:

$$V_{COMP\_P} = V_{SNS\_F} + V_{MON\_F}*(\alpha + V_{SNS\_F}*\beta) + T\text{mag}(\gamma + V_{SNS\_F}*\delta) \quad \text{Eq. 1}$$

wherein, Tmag is the temperature from the Temperature Sensor.

10. The instrument of claim 9, wherein $\alpha$, $\beta$, $\gamma$ and $\delta$ are obtained according to Eq. 1, and empirical data from conducting experiments on the probe of each probe type, yielding readings of the $V_{SNS\_F}$, $V_{MON\_F}$, $I_{SRC}$ from the corresponding Four-Wire ohmmeter and the temperature reading, $T_{mag}$ for the probe.

11. The instrument of claim 7, wherein the Hall Effect measurement circuitry further comprises a voltage source and a voltage source current stability monitoring circuit, providing a raw voltage differential data $V_{IMON\_R}$ factored by the current monitoring circuit, wherein $V_{IMON\_R}$ is further provided to the data acquisition and processing module.

12. The instrument of claim 11, wherein the signal processing module further provides a filtered differential voltage data $V_{IMON\_F}$ factored by the current monitoring circuit, based on the Hall Effect measurement value of raw voltage $V_{IMON\_R}$.

13. The instrument of claim 12, wherein the probe parameter temperature compensation module further comprises an a probe parameter temperature compensation calculator producing the factor $V_{COMP\_P}$ substantially according to the following:

$$V_{COMP\_P} = (((V_{SNS\_F}) + ((V_{MON\_F} - V_{IMON\_F})*A) + (((V_{MON\_F} - V_{IMON\_F})*(V_{SNS\_F})*B)/(V_{IMON\_F})) + ((T\text{mag}-22)*(V_{IMON\_F})*C) + ((T\text{mag}-22)*(V_{SNS\_F})*D))/(V_{IMON\_F})), \quad \text{Eq. 2}$$

wherein A, B, C and D are all coefficient accounting for manufacturing tolerances of the probe and the Hall Effect sensor.

14. The instrument of claim 13, wherein A, B, C and D are obtained according to Eq. 1, and empirical data from conducting experiments on the probe of each probe type, yielding readings of the $V_{SNS\_F}$, $V_{MON\_F}$, $V_{IMON\_F}$ from the corresponding Four-Wire ohmmeter and the temperature reading, $T_{mag}$ for the probe.

15. The instrument of claim 7 wherein the probe parameter temperature compensation module further comprises a probe slope temperature compensation calculator producing the factor $V_{COMP\_S}$ according to a probe slope derived according to experimental data collected on the probe, $$V_{COMP\_S} = \text{Probe Slope}*(T\text{mag}-\text{Reference Temperature}) \quad \text{Eq. 3}$$

wherein Tmag is the temperature reading.

16. The instrument of claim 15, wherein the probe slope is stored in the electronic erasable memory.

17. The instrument of claim 7, wherein the temperature compensation index calculation module calculates the temperature compensation index, deriving from the first compensation factor $V_{COMP\_P}$ and the second compensation factor $V_{COMP\_S}$ according to $$\text{Temperature Compensation Index } V_{COMP} = V_{COMP\_P} - V_{COMP\_S} \quad \text{Eq. 4.}$$

18. The instrument of claim 17, wherein the measurement conversion module is configured to produce the corrected Hall Effect measurement data based on the temperature compensation index $V_{COMP}$ for the probe and the target.

* * * * *